US008263225B2

(12) United States Patent
Hendricks et al.

(10) Patent No.: US 8,263,225 B2
(45) Date of Patent: Sep. 11, 2012

(54) LAMINATE COMPOSITION FOR PRODUCING REDUCED CURL FLAT THIN CORE LAMINATE

(75) Inventors: Cathy Hendricks, Chandler, AZ (US); Kathy Kelly, Chandler, AZ (US); Martin Choate, Chandler, AZ (US)

(73) Assignee: Isola USA Corp., Chandler, AZ (US)

( * ) Notice: Subject to any disclaimer, the term of this patent is extended or adjusted under 35 U.S.C. 154(b) by 900 days.

(21) Appl. No.: 10/858,344

(22) Filed: Jun. 1, 2004

(65) Prior Publication Data

US 2005/0266756 A1 Dec. 1, 2005

(51) Int. Cl.
*B32B 27/38* (2006.01)
*B32B 15/08* (2006.01)
*B32B 15/14* (2006.01)
*D03D 15/00* (2006.01)

(52) U.S. Cl. ........ 428/416; 428/413; 428/418; 442/117; 442/228; 442/232; 442/233

(58) Field of Classification Search .................. 442/180, 442/228, 232, 376, 378, 117, 233; 428/901, 428/413, 416, 418
See application file for complete search history.

(56) References Cited

U.S. PATENT DOCUMENTS

| 5,215,645 | A | * | 6/1993 | DiFranco et al. | ............... 205/77 |
| 5,454,926 | A | * | 10/1995 | Clouser et al. | ................... 205/50 |
| 5,464,658 | A | * | 11/1995 | Yuhas et al. | ............... 427/385.5 |
| 5,496,613 | A | * | 3/1996 | Middelman et al. | .......... 428/105 |
| 5,837,624 | A | * | 11/1998 | Sakaguchi et al. | ............ 442/208 |
| 2003/0054190 | A1 | | 3/2003 | Smith | |

FOREIGN PATENT DOCUMENTS

| EP | 1331088 | 7/2003 |
| EP | 1420621 | 5/2004 |
| WO | WO 97/00338 | 3/1997 |
| WO | WO 2004/039579 | 5/2004 |

* cited by examiner

*Primary Examiner* — Jennifer Chriss
*Assistant Examiner* — Jeremy R Pierce
(74) *Attorney, Agent, or Firm* — McDonnell Boehnen Hulbert & Berghoff LLP

(57) ABSTRACT

Copper clad laminates having reduced laminate curl include copper foil with a tensile strength of less than 47 ksi.

9 Claims, 2 Drawing Sheets

LAMINATE COMPOSITION FOR PRODUCING REDUCED CURL FLAT THIN CORE LAMINATE

BACKGROUND OF THIS INVENTION (1) Field of this invention

The invention concerns laminates for use in the printed wiring board industry. In particular, the invention concerns laminates exhibiting reduced curl.

(2) Description of the Related Art

The electronics industry continues to seek enhanced product performance in order to meet consumer demand for higher functionality and lower cost computers and electronics equipment. Consequently, as board shops continue to reduce laminate construction thickness to meet the demand for higher density interconnects, physical aspects of the laminate, such as laminate curl, become more apparent and problematic. There exists a need, therefore, for laminate systems that can be consistently processed to provide favorable characteristics, such as low curl.

SUMMARY OF THE INVENTION

The invention provides laminates and methods for preparing laminates, which exhibit consistently low curl, as measured on a flat plane.

Thus, in one aspect, the invention provides a copper-clad laminate comprising a prepreg and a copper foil joined to at least one surface of the prepreg, wherein the copper foil has a tensile strength of less than 47 ksi.

DESCRIPTION OF THE CURRENT EMBODIMENT

Figure 1:
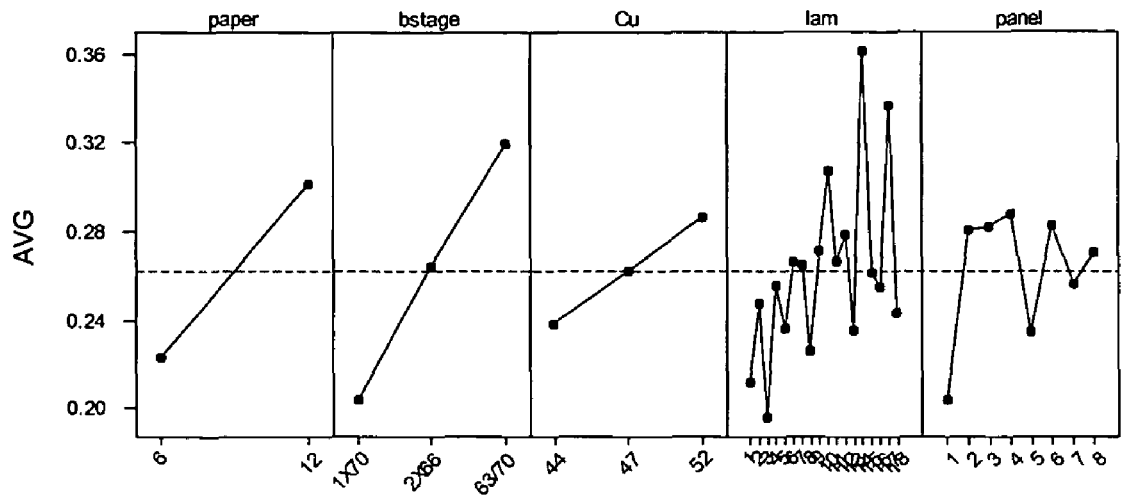
FIG. 1 depicts average curl of a laminate as a function of several factors, including copper tensile strength.

As noted above, the invention provides copper-clad laminates comprising a prepreg and a copper foil joined to at least one surface of the prepreg. The tensile strength of the copper is less than that commonly used in the art for preparing laminates. Surprisingly, the laminates of the invention exhibit reduced laminate curl as measured on a flat plane.

Preferably the copper foil used in the invention has a tensile strength of less than 47 ksi (kilopounds per square inch), more preferably less than 46 ksi, and even more preferably, less than 45 ksi. In particularly preferred embodiments, the tensile strength is 44 ksi, or is less than 44 ksi. The lower bound of the tensile strength is preferably approximately 42 ksi. The copper foil can be any thickness commonly used in the laminate and prepreg industry. Preferably, the foil is 1 oz foil or 0.5 oz foil, having tensile strength as indicated above.

Reducing laminate curl by reducing copper tensile strength is particularly effective in thin core laminates. For instance, it was found that 4 mil thin core laminates made with 44 ksi tensile strength copper foil exhibit an average curl value of less than 0.25 inches as measured on a flat plane. Generally, thin core laminates are laminates having a total laminate thickness of 8 mil or less. Preferably, the thin core laminate is single ply, i.e., comprises one prepreg with copper foil laminated on each side.

The prepreg to which the low tensile strength copper foil is joined generally comprises a core material that is impregnated with a thermosetting resin.

Any core material known in the industry can be used in the laminates of the invention. Examples of useful core materials include, but are not limited to, glass fiber, unwoven glass cloth, woven glass cloth and paper. A preferred core materials is woven glass cloth.

The thermosetting resin is generally transferred to the core material as a resin composition, and as such contains solvents and optional additives. The thermosetting resin of the composition can be any type used in the laminate/prepreg industry. Useful resins include, but are not limited to, polyimide resins, polyimide-containing resin systems, and epoxy resins, including novolac resins. Preferred resins include FR4 type resins, which are epoxy resins that are derivatives of bisphenol A, and include resins made by an advancing reaction of an excess of bisphenol A diglydicyl ether with tetrabromobisphenol A. One particularly preferred resin is FR406, which is available from Isola Laminate Systems, Chandler, Ariz., U.S.A. For thin core laminates, preferred resins exhibit high modulus, such as FR406. The resin is present in the resin composition in an amount from about 30% to about 90%, preferably from about 50 to about 80%, more preferably about 60% to about 70%, based on 100% by weight solids of the composition.

The resin composition can optionally include one or more fillers, to improve the chemical and electrical properties of the cured resin. Examples of properties that can be modified with fillers include, but are not limited to, coefficient of thermal expansion, lowering CTE, increasing modulus, and reducing prepreg tack. Non-limiting examples of useful fillers include particulate forms of Teflon®, talc, quartz, ceramics, particulate metal oxides such as silica, titanium dioxide, alumina, ceria, clay, boron nitride, wollastonite, and mixtures thereof. Preferred fillers include calcined clay or fused silica. Yet another preferred filler is silane treated silica. When used, fillers are present in the thermosetting resin composition in an amount from about 0% to about 20%, preferably from about 0 to about 10%, based on 100% by weight solids of the composition.

The thermosetting resin composition may include one or more tougheners. The tougheners are added to the resin composition to improve the drillability of the resulting composites and laminates. Useful tougheners include methyl methacrylate/butadiene/styrene copolymer, methacrylate butadiene styrene core shell particles, and mixtures thereof. A preferred toughener is methacrylate butadiene styrene core shell particles, which is available from Rohm & Haas (100 Independence Mall West, Philadelphia, Pa.), sold under the trade name Paraloid®. When used, tougheners are present in the thermosetting resin composition in an amount from about 1% to about 5%, preferably from about 2 to about 4%, based on 100% by weight solids of the composition.

One or more curing agents are optionally added to the thermosetting resin composition in order to enhance the rate of resin cure during prepreg processing. The curing agents chosen may be any agents that are know to speed up the rate of thermosetting resin cure. Preferred curing agents include peroxide agents that generate free radicals such as dicumyl peroxide, or tert-butyl peroxybenzoate (commercially available from, for example, Akzo-Nobel Polymer Chemicals LLC, Chicago, Ill. as Triganox-C). Other preferred curing agents include metal acetylacetonate complexes (metal acac).

A more preferred curing agent is dicumyl peroxide. When used, curing agents are present in the thermosetting resin composition preferably in an amount of from about 0% to about 30%, more preferably from about 12% to about 25%, based on 100% by weight resin solids of the composition.

The thermosetting resin composition may include one or more flame retardants. Any flame retardant that is known to be useful in resin compositions used to manufacture composites and laminates may be used. Examples of useable flame retardants include, but are not limited to, halides of glycidyl etherified bifunctional alcohols, halides of novolac resins such as bisphenol A, bisphenol F, polyvinylphenol or phenol, creosol, alkylphenol, catecohl, and novolac resins such as bisphenol F, inorganic flame retardants such as antimony trioxide, red phosphorus, zirconium hydroxide, barium metaborate, aluminum hydroxide, and magnesium hydroxide, and phosphor flame retardants such as tetraphenyl phosphine, tricresyl-diphenyl phosphate, triethylphosphate, cresyldiphenylphosphate, xylenyl-diphenyl phosphate, acid phosphate esters, phosphate compounds containing nitrogen, and phosphate esters containing halides.

One or more solvents are typically incorporated into the resin composition in order to provide resin solubility, control resin viscosity, and in order to maintain the resin ingredients in a suspended dispersion, and to facilitate transfer of the resin to the core material. Any solvent known by one of skill in the art to be useful in conjunction with thermosetting resin systems can be used. Particularly useful solvents include methylamylketone (MAK), methylethylketone (MEK), toluene, gamma-butyrolactone (BLO), propylene glycol methyl ethyl ether acetate (PMA), or mixtures thereof. The choice of solvent is often dictated by the resin curing method. When the resin is cured with hot air, then ketones are typically the preferred solvent. When the resins are IR cured, then a mixture of ketones and toluene is typically preferred. When used, solvents are present in the thermosetting resin composition in an amount of from about 20% to about 50% as a weight percentage of the total weight of the composition.

The thermosetting resin composition may further contain other additives such as defoaming agents, leveling agents, dyes, and pigments. For example, a fluorescent dye can be added to the resin composition in a trace amount to cause a laminate prepared therefrom to fluoresce when exposed to UV light in a board shop's optical inspection equipment. A useful fluorescent dye is a highly conjugated diene dye. One example of such a dye is UVITEX® OB (2,5-thiophenediyl-bis(5-tert-butyl-1,3-benzoxazole), available from Ciba Specialty Chemicals, Tarrytown, N.Y.

Prepregs are generally manufactured using a core material such as a roll of woven glass web which is unwound into a series of drive rolls. The web then passes into a coating area where the web is passed through a tank which contains a thermosetting resin composition, including solvents and other components as discussed above. The glass web becomes saturated with the resin in the coating area. The resin saturated glass web is then passed through a pair of metering rolls which remove excess resin from the resin saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll.

Lamination process typically entail a stack-up of one or more prepreg layers between one or two sheets of conductive foil (such as copper foil). Lamination methods and parameters may vary widely, and are generally well known to the person of ordinary skill in the art. In a typical cure cycle, the stack is maintained at a pressure of about 40 psi to about 900 psi and under a vacuum of about 30 in/Hg. The stack temperature is raised from about 180° F. to about 375° F. over a period of about 20 minutes. The stack remains at a temperature of about 375° F. for 75 minutes after which the stack is cooled from a temperature of 375° F. to a temperature to 75° F. over a 20 minute period.

In another process for manufacturing laminates, a thermosetting resin composition is premixed in a mixing vessel under ambient temperature and pressure. The viscosity of the pre-mix is about 600-1000 cps and can be adjusted by adding or removing solvent from the resin. Fabric substrate (typically but not limited to E glass) is pulled through a dip tank including the premixed resin, through an oven tower where excess solvent is driven off and the prepreg is rolled or sheeted to size, layed up between Cu foil in various constructions depending on glass weave style, resin content & thickness requirements.

A thermosetting resin composition can also be coated directly on Cu substrate (RCC—resin coated Cu) using slot-die or other related coating techniques.

The following examples are illustrative of various aspects of the invention but do not serve to limit its scope.

EXAMPLES

A series of experiments were conducted to quantitatively determine the influence of various materials and process factors on the laminate curl. Thus single ply thin core laminates were prepared and the amount of curling measured. It was found that although there are multiple contributing factors to the curl phenomena, the tensile strength of the copper foil has the largest influence. Lower tensile strength copper foil was found to significantly reduce curl by approximately 50% in thin core constructions of 4 mil or less. This change can be transparently introduced to current manufacturing systems in harmony with other less significant process factors.

Example 1

A $2^4$ experiment with one nested factor (the press) was run in randomized replication, with two factors having three levels and two factors having two levels. Eighteen laminates per book were used in each press. Analysis was performed using Minitab™ 13.32 General Linear Model (GLM) at the 0.05 level. The experimental factors studies were as follows:
Experimental Factors
Factor Levels
    Press (heat rise) One (heat rise 4.42 F°/min), Two (3.5 F°/minute)
    Paper plys 6, 12
    B-stage construction 1×70%, 2×66%, 1×63% and 70% using 106 fabric
    with FR 406 resin.
    Cu Ten Stg, Ksi, 1.0 oz @20° C. 44 (21.4%), 47 (20.4%), 52 (17.2%)*
*corresponding elongation values @20° C. are in ( )
Measured Responses
    Average curl for each of the four corners measured
    Range of the four curl measurements.
    Tg's were measured to insure that all samples were cured.
    Interfilament Yarn Voids (IYV's).
    Panel thickness
Materials and Processing.

Core Configurations. Three different core configurations were studied, all using Hexcel 106 CS4552 fabric and FR 406 resin:
- 1× resin content of 70% (0.002" core), [the thickness of the fabric and cured resin]
- 2× resin content 66% (0.0035" core) and
- 1 each resin content 63% and 70% (0.0035").

Copper. 1.0 ounce copper foil at tensile strength (ksi at 20° C.) of 44, 47 and 51 was studied. The foil, designated THE-NT-TWB copper foil by the supplier, was obtained from Circuit Foil, Fremont, Calif.

Lamination. [The lot numbers represent traceability references within the plant]

Sample Press
- A 1
- B 2

Results

Since the press was a nesting factor, the only analysis that could be done directly between the two presses was an Analysis of Variance (ANOVA) showing the relative curl contribution as a result of the process. In this case, heat rise is the parameter.

| All measurements in inches | P1[1] (heat rise 4.42° F./min) | | | P2[2] (3.5 ° F./minute) | | |
| --- | --- | --- | --- | --- | --- | --- |
| | Avg | stdev | n | Avg | stdev | n |
| Curl average | 0.262 | 0.109 | 288 | 0.197 | 0.079 | 216 |
| Curl Range | 0.298 | 0.152 | 288 | 0.242 | 0.178 | 216 |

P1 is press 1;
P2 is press 2.

Press 2 utilizing the slower heat rate, exhibited less overall curl for all conditions. The data spread is large due to the extreme levels used for the other three factors. Each press was then analyzed for main effects and interactions shown in the Figures below.

Figure 2:
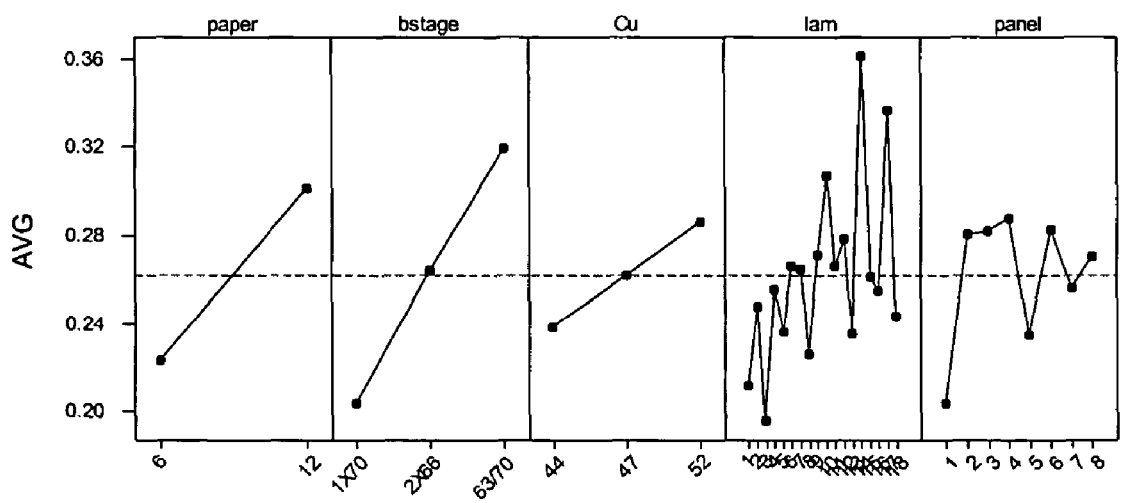
FIG. 2 depicts curl range in a laminate as a function of several factors, including copper tensile strength.
Figure 3:
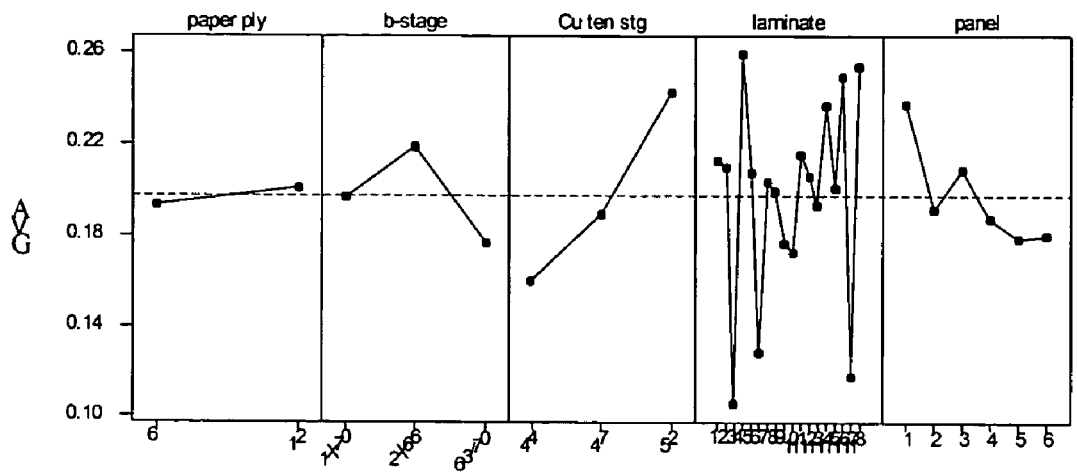
FIG. 3 depicts average curl of a laminate as a function of several factors, including copper tensile strength.
Figure 4:
FIG. 4 depicts curl range in a laminate as a function of several factors, including copper tensile strength.

Effect of the experimental factors for press 1 and press 2 on laminate curl (average and range) are shown in FIGS. 1-4. In particular, FIGS. 1 and 2 show average and range of laminate curl in press 1, respectively. FIGS. 3 and 4 show average and range of laminate curl in press 2, respectively. In the figures, paper refers to the number of paper plys; bstage refers to the core configurations; Cu refers to copper tensile strength, lam refers to location of the laminate within the book, or stack of laminates; panel refers to location of the individual panel on a laminate).

Curl Average

For laminates produced in both presses, the overall process variation, as exhibited by the variability of the curl for laminates and individual panels, show significant contribution to curl. This is demonstrated by the large variation in curl on the main factor plots. The models accounted for 67 percent of the total variation for Press 1 (faster heat rise) and 69 percent of the total Press 2 variation (slower heat rise).

The factors that are controllable are the number of paper plys used in each book, the copper tensile strength and the B-stage construction. All three are significant contributors to curl for Press 1 while only B-stage and Copper tensile were significant for Press 2. The data indicates that lower copper tensile strength contributes to less curl.

Curl Range

For laminates produced in both presses, the overall process variation as exhibited by the variability of the curl for laminates and individual panels were significant contributors. This is demonstrated by the large variation in curl on the main factor plots (FIGS. 1-4). The models accounted for 81 percent of the total variation for Press 1 (faster heat rise) and 77 percent of the total Press 2 variation (slower heat rise).

The factors that are controllable are the number of paper plys used in each book, the copper tensile strength and the B-stage construction. Of these three, for Press 1, paper ply was the only controllable significant main effect. For Press 2 the copper tensile strength-B-stage interaction was significant. Since the analysis is hierarchical, meaning that if an interaction is significant, its component main effects are also significant. The data indicates that lower copper tensile strength contributes to less curl.

In summary, the results indicate that although there are multiple contributing factors to the curl phenomena, the tensile strength of the copper foil has the largest influence. Lower tensile strength copper foil was found to significantly reduce curl in thin core laminate constructions.

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

We claim:

1. A copper-clad laminate comprising a resin core having a first surface and a second surface, and a copper foil joined to at least one surface of the core, wherein the copper foil has a tensile strength of less than 47 ksi measured at 20° C., and wherein the core has a thickness of 4 mils or less and the copper foil is selected from 1 oz copper foil or 0.5 oz copper foil.

2. The copper-clad laminate of claim 1 wherein the copper foil has a tensile strength of less than 45 ksi.

3. The copper-clad laminate of claim 1 wherein the copper foil has a tensile strength of about 42 ksi.

4. The laminate of claim 1 wherein the resin is a FR4 resin.

5. The copper-clad laminate of claim 1 wherein a copper foil is joined to both the core first surface and the core second surface.

6. The copper-clad laminate of claim 1 wherein the resin core includes woven fiber.

7. The copper-clad laminate of claim 1 having a curl of less than 0.25 inches measured on a flat plane.

8. The copper clad laminate of claim 1 wherein the resin core is a prepreg core.

9. A copper-clad laminate comprising a prepreg core having a first surface and a second surface, and a copper foil joined to at least one surface of the prepreg core, wherein the copper foil has a tensile strength of less than 47 ksi measured at 20° C., wherein the prepreg core has a thickness of 4 mils or less, and wherein the copper foil is 0.5 oz copper foil.

* * * * *